United States Patent
Cheng et al.

(10) Patent No.: US 10,200,000 B2
(45) Date of Patent: *Feb. 5, 2019

(54) HANDHELD ELECTRONIC APPARATUS, SOUND PRODUCING SYSTEM AND CONTROL METHOD OF SOUND PRODUCING THEREOF

(71) Applicant: HTC Corporation, Taoyuan (TW)

(72) Inventors: Chih-Chiang Cheng, Taoyuan (TW); Chun-Min Lee, Taoyuan (TW); Hann-Shi Tong, Taoyuan (TW); Lei Chen, Taoyuan (TW); Che-Yi Hsiao, Taoyuan (TW); Chin-Kuo Huang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/139,312

(22) Filed: Apr. 26, 2016

(65) Prior Publication Data

US 2016/0241960 A1 Aug. 18, 2016

Related U.S. Application Data

(63) Continuation-in-part of application No. 14/335,954, filed on Jul. 21, 2014, now Pat. No. 9,614,489, which
(Continued)

(51) Int. Cl.
*H04R 3/00* (2006.01)
*H03G 3/20* (2006.01)
(Continued)

(52) U.S. Cl.
CPC ............. *H03G 3/20* (2013.01); *H03G 3/3005* (2013.01); *H03G 7/002* (2013.01); *H03G 7/007* (2013.01);
(Continued)

(58) Field of Classification Search
CPC ...... H04R 29/001; H04R 3/002; H04R 3/007; H04R 2499/11; H03G 3/20; H03G 7/002;
(Continued)

(56) References Cited

U.S. PATENT DOCUMENTS

| | | | |
|---|---|---|---|
| 4,060,764 A | * | 11/1977 | Bethards .................. H04B 1/64 333/14 |
| 5,331,291 A | | 7/1994 | D'Agostino et al. |

(Continued)

FOREIGN PATENT DOCUMENTS

| | | |
|---|---|---|
| EP | 2348750 | 7/2011 |
| EP | 2369852 | 9/2011 |

(Continued)

OTHER PUBLICATIONS

"Office Action of Taiwan Counterpart Application," dated Mar. 23, 2017, p. 1-p. 6 in which the listed reference was cited.

(Continued)

*Primary Examiner* — Vivian Chin
*Assistant Examiner* — Con P Tran
(74) *Attorney, Agent, or Firm* — JCIPRNET

(57) ABSTRACT

A handheld electronic, a sound produce system and control method of sound producing thereof are provided. The sound produce system includes a speaker, a feedback unit, a gain unit and a compensation unit. The speaker generates audible sound according to an output audio signal. The feedback unit generates a first detected parameter, wherein the first detected parameter represents a detected excursion. The gain unit receives an input audio signal, and amplifies the input audio signal to generate a gained audio signal according to a gain value. The compensation unit receives the gained audio signal and the first detected parameter, and predicts an excursion of the speaker corresponding to the gained audio signal to generate a predicted excursion parameter, and (Continued)

compensates the gained audio signal to generate the output audio signal according to the first detected parameter and the predicted excursion parameter.

19 Claims, 7 Drawing Sheets

Related U.S. Application Data is a continuation-in-part of application No. 13/752,375, filed on Jan. 28, 2013, now Pat. No. 9,173,020.

(60) Provisional application No. 61/615,904, filed on Mar. 27, 2012, provisional application No. 61/932,261, filed on Jan. 28, 2014.

(51) Int. Cl.
| | | |
|---|---|---|
| *H04R 29/00* | (2006.01) | |
| *H03G 7/00* | (2006.01) | |
| *H03G 9/00* | (2006.01) | |
| *H03G 3/30* | (2006.01) | |
| *H03G 9/18* | (2006.01) | |

(52) U.S. Cl.
CPC ............. *H03G 9/005* (2013.01); *H03G 9/18* (2013.01); *H04R 3/002* (2013.01); *H04R 3/007* (2013.01); *H04R 29/001* (2013.01); *H04R 2499/11* (2013.01)

(58) Field of Classification Search
CPC ........ H03G 9/18; H03G 9/005; H03G 3/3005; H03G 7/007
USPC ...... 381/59, 58, 96, 107, 108, 104, 105, 106
See application file for complete search history.

(56) References Cited

U.S. PATENT DOCUMENTS

| | | | |
|---|---|---|---|
| 5,548,650 | A | 8/1996 | Clark |
| 5,729,611 | A * | 3/1998 | Bonneville ............... H03F 1/52 |
| | | | 381/55 |
| 6,931,135 | B1 | 8/2005 | Kohut |
| 7,039,206 | B2 | 5/2006 | Mellow |
| 7,274,793 | B2 | 9/2007 | Combest et al. |
| 8,019,088 | B2 | 9/2011 | Holman |
| 8,351,621 | B2 | 1/2013 | Lehnert et al. |
| 2003/0072462 | A1 | 4/2003 | Hlibowicki |
| 2006/0104451 | A1* | 5/2006 | Browning ............ H04R 29/003 |
| | | | 381/59 |
| 2007/0140058 | A1* | 6/2007 | McIntosh ................. H04R 3/04 |
| | | | 367/140 |
| 2007/0160221 | A1* | 7/2007 | Pfaffinger ............ H04R 29/001 |
| | | | 381/59 |
| 2012/0179456 | A1 | 7/2012 | Ryu et al. |
| 2012/0281844 | A1 | 11/2012 | Luo et al. |
| 2013/0022208 | A1 | 1/2013 | Dhuyvetter |
| 2013/0077795 | A1 | 3/2013 | Risbo et al. |
| 2013/0195277 | A1 | 8/2013 | Kannan et al. |
| 2013/0259245 | A1 | 10/2013 | Cheng et al. |
| 2015/0010168 | A1 | 1/2015 | Cheng et al. |

FOREIGN PATENT DOCUMENTS

| | | |
|---|---|---|
| EP | 2538699 | 12/2012 |
| EP | 2645740 | 10/2013 |
| TW | I521981 | 2/2016 |
| WO | 0103466 | 1/2001 |
| WO | 2011115944 | 9/2011 |

OTHER PUBLICATIONS

"Search Report of Europe Counterpart Application", dated Sep. 13, 2017, p. 1-p. 4, in which the listed references were cited.

* cited by examiner

HANDHELD ELECTRONIC APPARATUS, SOUND PRODUCING SYSTEM AND CONTROL METHOD OF SOUND PRODUCING THEREOF

CROSS-REFERENCE TO RELATED APPLICATION

This application is a continuation-in-part application of and claims the priority benefit of U.S. prior application Ser. No. 14/335,954, filed on Jul. 21, 2014, now allowed. The prior U.S. application Ser. No. 14/335,954 is a continuation-in-part application of and claims the priority benefit of a prior application Ser. No. 13/752,375, filed on Jan. 28, 2013, now patented as U.S. Pat. No. 9,173,020, issued on Oct. 27, 2015, which claims the priority benefit of U.S. Provisional application Ser. No. 61/615,904, filed on Mar. 27, 2012. The prior U.S. prior application Ser. No. 14/335,954 also claims the priority benefits of U.S. provisional application Ser. No. 61/932,261, filed on Jan. 28, 2014. The entirety of each of the above-mentioned patent applications is hereby incorporated by reference herein and made a part of this specification.

BACKGROUND OF THE INVENTION

Field of the Invention

The invention relates to a handheld electronic apparatus, a sound producing system thereof and a control method of sound producing thereof, and particularly relates to a handheld electronic apparatus capable of compensating harmonic distortion of a speaker, a sound producing system thereof and a control method of sound producing thereof.

Description of Related Art

In recent years, in order to provide high quality multimedia functions, electronic apparatus is generally configured with a high quality sound producing system. In the conventional technical field, a speaker in the sound producing system is generally limited by factors of the maximum excursion, temperature raise, non-linear characteristics of a transducer, and non-linear factors caused by an amplifier corresponding to the speaker. Therefore, manufacturers determine the method for driving the speaker, by which the speaker is driven by a rated power in a long-term period, and is driven by the highest power in a short-term period. The aforementioned limitation conditions of driving power intend to limit the maximum excursion and the temperature raise of the speaker to be within a safety range. In order to reproduce signals with a wide dynamic range without distortion, loudness of the speaker is decreased, which especially occurs on a handheld device operated under the power limitation conditions. Therefore, in recent decades, a dynamic range compression technique is generally adopted to control the driving operation of the speaker, so as to make a balance between the distortion and the loudness.

Moreover, the conventional technique further provides a method for first compensating an input audio signal and then amplifying the compensated audio signal, though the compensation operation performed to the original input audio signal is rather complicated, and it has high difficulty in implementation to complete the accurate compensation operation.

SUMMARY OF THE INVENTION

The invention is directed to a sound producing system and a control method of sound producing, which may effectively compensate a harmonic distortion phenomenon of a speaker.

The invention is further directed to a handheld electronic apparatus, which applies the aforementioned sound producing system and the control method of sound producing, so as to improve sound playing quality.

The invention provides a sound producing system including a speaker, a feedback unit, a gain unit and a compensation unit. The speaker generates an audible sound according to an output audio signal. The feedback unit is coupled to the speaker, and generates a first detected parameter, where the first detected parameter represents a detected excursion of the speaker. The gain unit receives an input audio signal, and amplifies the input audio signal to generate a gained audio signal according to a gain value. The compensation unit is coupled to the gain unit and the feedback unit. The compensation unit receives the gained audio signal and the first detected parameter, and predicts an excursion of the speaker corresponding to the gained audio signal to generate a predicted excursion parameter, and compensates the gained audio signal to generate the output audio signal according to the first detected parameter and the predicted excursion parameter.

The invention provides a control method of sound producing, which includes following steps. A first detected parameter is generated, where the first detected parameter represents a detected excursion of a speaker. An input audio signal is received, and the input audio signal is amplified to generate a gained audio signal according to a gain value. The gained audio signal and the first detected parameter are received, and an excursion of the speaker corresponding to the gained audio signal is predicted to generate a predicted excursion parameter, and the gained audio signal is compensated to generate an output audio signal according to the first detected parameter and the predicted excursion parameter.

Moreover, the invention provides a handheld electronic apparatus including a processing unit and the aforementioned sound producing system. The processing unit generates an input audio signal, the sound producing system is coupled to the processing unit and receives the input audio signal, and the sound producing system generates an audible sound according to an output audio signal.

According to the above descriptions, in the invention, the input audio signal is first amplifier, and then the amplified gained audio signal is compensated. In this way, a hardware structure and an operation method of the compensation unit can all be effectively simplified, and the compensation effect for the harmonic distortion achieved by the compensation unit is further improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
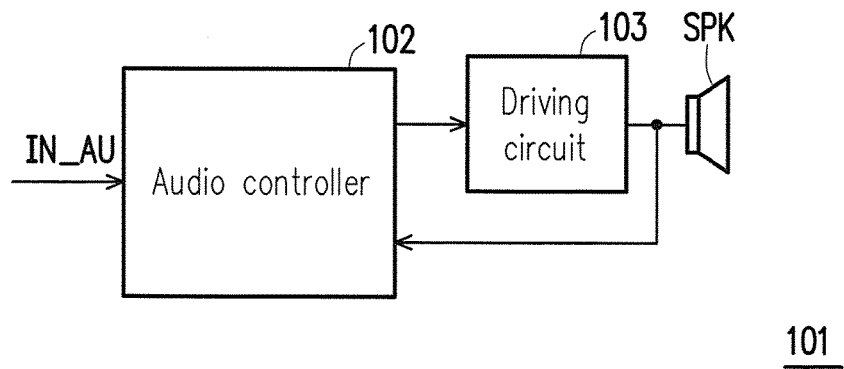
FIG. 1A illustrates a sound producing system according to an exemplary embodiment of the present application.

Referring to FIG. 1A, FIG. 1A illustrates a sound producing system according to an exemplary embodiment of the present application. The sound producing system 101 includes an audio controller 102, a driving circuit 103 and a speaker SPK. The speaker SPK is used for producing an audible sound. The driving circuit 103 is coupled to the speaker SPK and provides a signal for driving the speaker SPK. The audio controller 102 is coupled to the speaker SPK and the driving circuit 103. The audio controller 102 is configured to receive and process an input audio signal IN_AU, and generate an output audio signal and convert the same into a driving voltage. The driving circuit 103 provides the driving voltage to the speaker SPK for driving the speaker SPK.

In detail, the audio controller 102 receives an amplify gain and pre-amplifies the input audio signal IN_AU with the amplify gain to obtain a pre-amplified audio signal. Then, the audio controller 102 operates a multi-band dynamic range control operation on the pre-amplified audio signal for generating the output audio signal. Furthermore, the audio controller 102 may convert the output audio signal to the driving voltage, and the driving voltage may be transported to the speaker SPK through the driving circuit 103 for driving the speaker SPK.

On the other hand, the audio controller 102 detects over the driving circuit 103 to obtain at least one excursion parameter of the speaker SPK. The audio controller 102 may determine an estimated excursion of the speaker SPK according to the at least one excursion parameter in response to the driving voltage. Also, the audio controller 102 adjusts the amplify gain according to the estimated excursion.

Please note here, the audio controller 102 may operate the multi-band dynamic range control on the pre-amplified audio signal for generating a compressed audio signal. Then, the audio controller 102 may limit an overall level of the compressed audio signal to a threshold level by applying a limiting gain to the compressed audio signal for limiting the level of the output audio signal and obtaining a limited audio signal as the output audio signal. The limiting gain may also be adjusted according to the estimated excursion of the speaker SPK by the audio controller 102.

The speaker SPK has at least one diaphragm. The diaphragm has a highest response over a resonance frequency. In response thereto, the audio controller 102 is operative to operate a first dynamic range control operation over a first frequency band of the pre-amplified audio signal, and the first frequency band is below the resonant frequency. Moreover, the audio controller 102 is operative to operate a second dynamic range control operation over a second frequency band of the pre-amplified audio signal, and the second band is higher than the resonant frequency. Especially, the compression ratio of the first dynamic range control operation is higher than the compression ratio of the second dynamic range control operation.

The audio controller 102 is also operative to buffer the pre-amplified audio signal, and filter the buffered pre-amplified audio signal over at least two frequency bands to obtain at least two filtered audio signals each corresponding to one of the at least two frequency bands. The audio controller 102 operates at least two separated dynamic range controls over the at least two filtered audio signals respectively to obtain at least two compressed filtered audio signals. Additionally, the audio controller 102 obtains the compressed audio signal by summing the at least two compressed filtered audio signals.

About the estimated excursion, the audio controller 102 receives a driving current on the driving circuit 103, and generates a first excursion parameter accordingly. Where the driving current is generated in response to the driving voltage applied on the speaker SPK, and the driving current is fed back to the audio controller 102 from the speaker SPK. On the other hand, the output audio signal generated by the audio controller 102 may be used to generate a second excursion parameter. That is, the audio controller 102 may determine the estimated excursion of the speaker SPK in response to the driving voltage based on the first excursion parameter and the second excursion parameter.

In the operation, the input audio signal IN_AU is transported to the audio controller 102 in continuity. The audio controller 102 may delay the input audio signal IN_AU to obtain a first input audio signal for looking ahead. Based on the first input audio signal, an estimated excursion of the speaker SPK in response to the first input audio signal can be determined by the audio controller 102, and whether the first estimated excursion enters a non-linear region of a force factor or stiffness for the speaker SPK can be determined accordingly. When the estimated excursion enters the non-linear region, the audio controller 102 may compensate the first input audio signal to generate a second input audio signal, and the audio controller 102 may pre-amplify the second input audio signal with the amplify gain to obtain the pre-amplified audio signal. Besides, based on the estimated excursion of the speaker SPK in response to the first input audio signal, whether the excursion of the speaker SPK exceeds a maximum allowable value can be determined accordingly. When the estimated excursion of the speaker SPK exceeds an excursion threshold (where the excursion threshold is corresponding to the value of the estimated excursion when the audio controller 102 may assume the excursion of the speaker SPK has exceeded the maximum allowable excursion), the audio controller 102 may reduce the amplify gain, and the excursion of the speaker SPK can be controlled to prevent from exceeding the maximum allowable value and to prevent the damage of the speaker SPK. The excursion threshold may be predetermined according to the physical characteristics of the speaker. The excursion threshold can also be a predetermined threshold which the audio controller 102 may hard clip or soft clip the output audio signal to prevent the speaker SPK from damage.

About the driving circuit 103, a digital to analog converter and an amplifier may be disposed in the driving circuit 103. The digital to analog converter is used to convert the output audio signal to an analog output signal, and the amplifier is used to amplify the analog output audio signal under a bias voltage to obtain the driving voltage. The bias voltage may be controlled from the audio controller 102, and the audio controller 102 may detect a signal level of the first input audio signal over a time span, and adjust a level of the bias voltage based on the signal level of the first input audio signal. That is, the signal level of the first input audio signal may be monitored, and when the first input audio signal with small volume is inputted to the audio controller 102, the voltage level of the bias voltage for the amplifier can be reduced, and power consumption can be saved.

Figure 1B:
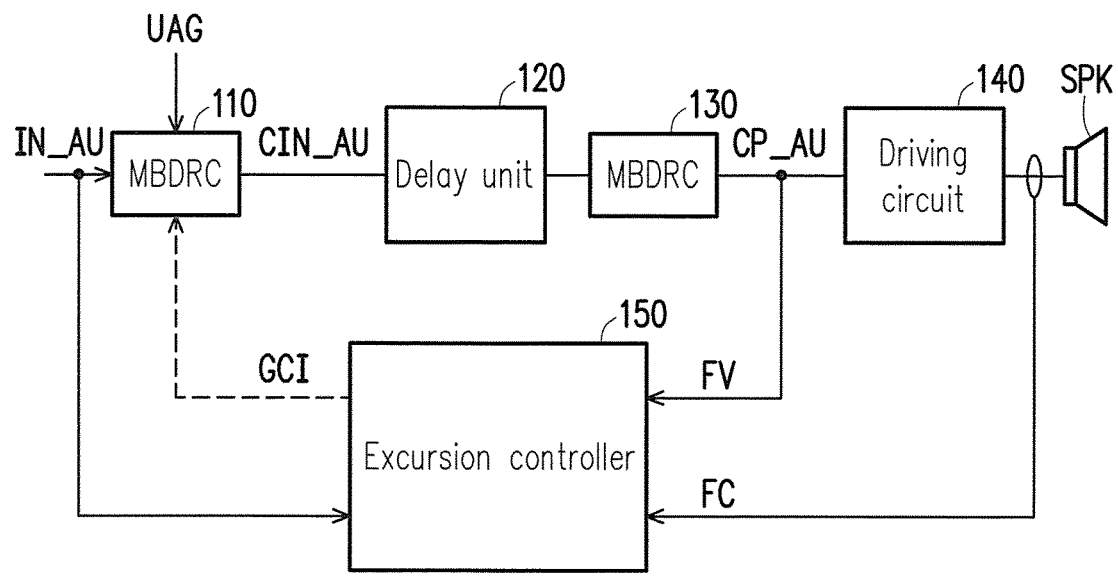
FIG. 1B illustrates a block diagram of another sound producing system 104 according to an exemplary embodiment of the present invention.

Referring to FIG. 1B, FIG. 1B illustrates a block diagram of another sound producing system 104 according to an exemplary embodiment of the present invention. The sound producing system 104 includes an automatic gain controller (AGC) 110, a delay unit 120, a multi-band dynamic range controller (MBDRC) 130, a limiter (not shown), a driving circuit 140 and an excursion controller 150. The sound producing system 104 is used to drive a speaker SPK.

The AGC 110 receives an input audio signal IN_AU and an amplify gain UAG, where the amplify gain UAG is provided by an application processor according to the setting of a playback application or instruction from an user, and the AGC 110 controls a gain of the input audio signal IN_AU to generate a pre-amplified audio signal CIN_AU according to the amplify gain UAG. The delay unit 120 is coupled between an output of the AGC 110 and an input of the MBDRC 130. The delay unit 120 provides a delay time for transporting the pre-amplified audio signal CIN_AU to the input of the MBDRC 130. The MBDRC 130 is coupled to the delay unit 120 for receiving the pre-amplified audio signal CIN_AU from the delay unit 120, and the MBDRC 130 operates a multi-band dynamic range control operation on the pre-amplified audio signal CIN_AU to generate an output audio CP_AU. A gain limiter may be used to limit the level of the output audio CP_AU. In FIG. 1B, the output audio CP_AU is transported to the driving circuit 140, and the driving circuit 140 amplifies the output audio CP_AU to drive the speaker SPK.

On the other hand, the excursion controller 150 is coupled between the driving circuit 140 and the AGC 110 to form a feedback circuit. The excursion controller 150 receives a voltage signal received by the driving circuit 140 to formed a feedback voltage FV, and the excursion controller 150 also receives a current flowing through the speaker SPK to foam a feedback current FC. The excursion controller 150 generates a first gain control signal GC1 according to the input audio signal IN_AU, the feedback voltage FV and the feedback current FC, and provided the first gain control signal GC1 to the AGC 110 to notify the ACG 110 whether an estimated excursion of the speaker SPK enters a non-linear region of a force factor or stiffness for the speaker. Accordingly, the sound producing system 104 may compensate the first input audio signal to generate a second input audio signal when the ACG 110 receives the first gain control signal GC1 notifying that the estimated excursion of the speaker SPK enters the non-linear region.

In detail, the MBDRC 130 divides the pre-amplified audio signal CIN_AU into a plurality of parts according to a plurality of different frequency bands. The MBDRC 130 respectively operates a plurality of controlling (compressing or expanding) operations on the plurality of parts of the pre-amplified audio signal CIN_AU. The controlling operations respectively corresponding to the frequency bands may be different. That is, the different frequency bands of the pre-amplified audio signal CIN_AU can be respectively compressed or expanded by different methods to obtain an optimized audio signal.

It should be noted here, the estimated excursion of the speaker SPK is important in the embodiment. The excursion controller 150 calculates the estimated excursion of the speaker SPK according to the feedback voltage FV and the feedback current FC, and the excursion controller 150 generate the first gain control signal GC1 to notify the AGC 110 according to the estimated excursion and the input audio signal. For example, the excursion controller 150 calculates the estimated excursion of the speaker SPK according to the feedback voltage FV and the feedback current FC. For example, the excursion controller 150 calculates the estimated excursion of the speaker SPK by the impedance which is calculated by the feedback voltage FV and the feedback current FC, and obtains the first gain control signal GC1 according to the estimated excursion.

Figure 2:
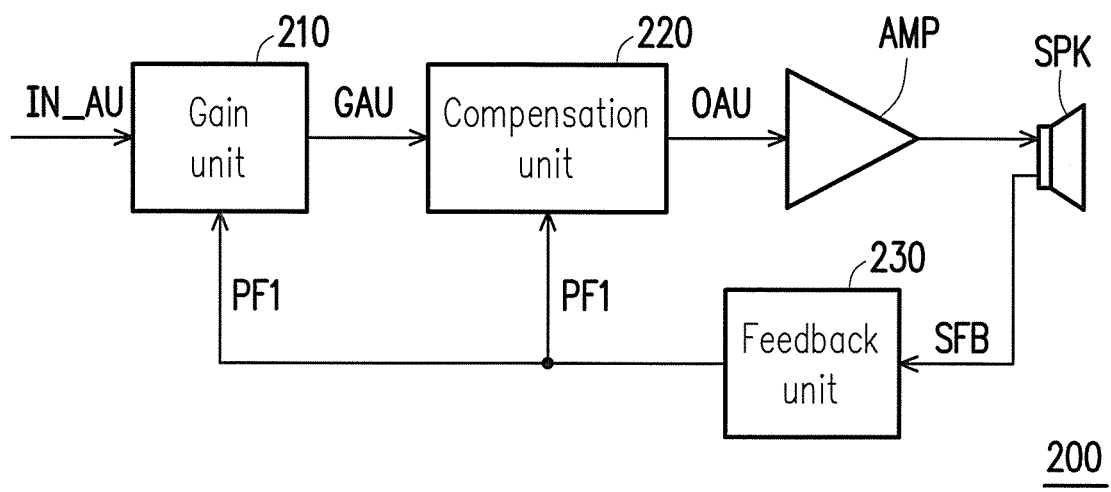
FIG. 2 is a schematic diagram of a sound producing system according to another embodiment of the invention.

On the other hand, referring to FIG. 2, FIG. 2 is a schematic diagram of a sound producing system according to another embodiment of the invention. The sound producing system 200 includes a gain unit 210, a compensation unit 220, and amplifier AMP, a speaker SPK and a feedback unit 230. The gain unit 210 receives an input audio signal IN_AU, and amplifies the input audio signal IN_AU to generate a gained audio signal GAU according to a gain value, where the gain value can be any real number greater than 1. The compensation unit 220 is coupled to the gain unit 210, and receives the gained audio signal GAU. Moreover, the compensation unit 220 is also coupled to the feedback unit 230, and receives a detected parameter PF1 transmitted by the feedback unit 230. Wherein, the detected parameter PF1 represents a detected excursion of the speaker SPK. The compensation unit 220 predicts an excursion of the speaker SPK corresponding to the gained audio signal GAU to generate a predicted excursion parameter, and compensates the gained audio signal GAU to generate an output audio signal OAU according to the detected parameter PF1 and the predicted excursion parameter.

Moreover, the feedback unit 230 is coupled to the speaker SPK, and detects an excursion produced by the diaphragm (i.e., the excursion of the diaphragm) of the speaker SPK, and generates the detected parameter PF1 corresponding to the detected excursion of the speaker SPK according to a detected result. In the present embodiment, the feedback unit 230 may perform a detection operation on the excursion of the speaker SPK according to one or a plurality of feedback signal SFB transmitted by the speaker SPK. The feedback signal SFB may be at least one of the voltage signal and the current signal on the speaker SPK.

Figure 3:
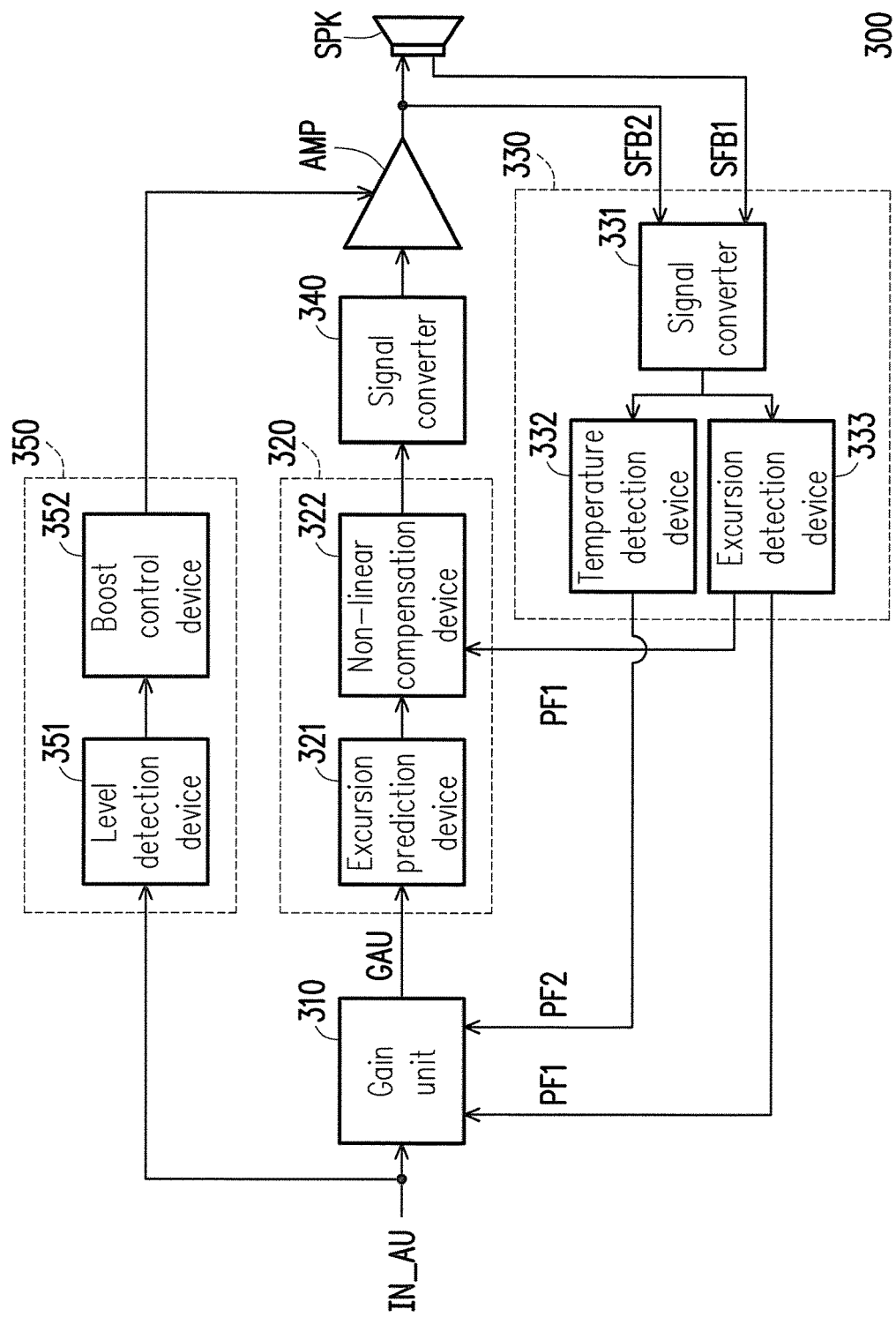
FIG. 3 is a schematic diagram of a sound producing system according to still another embodiment of the invention.

Referring to FIG. 3, FIG. 3 is a schematic diagram of a sound producing system according to still another embodiment of the invention. The sound producing system 300 includes a gain unit 310, a compensation unit 320, an amplifier AMP, a speaker SPK, a feedback unit 330, a signal converter 340 and a bias adjustment unit 350. The compensation unit 320 includes an excursion prediction device 321 and a non-linear compensation device 322. The feedback unit 330 includes a signal converter 331, a temperature detection device 332 and an excursion detection device 333. The bias adjustment unit 350 includes a level detection device 351 and a boost control device 352.

In view of operation detail, the gain unit 310 receives an input audio signal IN_AU, and amplifies the input audio signal IN_AU to generate a gained audio signal GAU according to a gain value. In the present embodiment, the gain unit 310 further receives detected parameters PF1 and PF2 respectively generated by the temperature detection device 332 and the excursion detection device 333, where the detected parameter PF1 is used for indicating a detected excursion of the speaker SPK, and the detected parameter PF2 is used for indicating a detected temperature of the speaker SPK.

It should be noted that the gain unit 310 may set the gain value according to the detected parameters PF1 and PF2, and adjust the gain value according to variation of at least one of the detected parameters PF1 and PF2. To be specific, when the detected parameter PF1 indicates that the excursion of the speaker SPK is increased, the gain unit 310 may decrease the gain value under a suitable state, so as to control the excursion of the speaker SPK to be under the maximum excursion of the speaker SPK. Moreover, when the detected parameter PF2 indicates that the temperature of the speaker SPK is excessively increased, the gain unit 310 may decrease the gain value according to the detected parameter PF2, so as to control the temperature of the speaker SPK to avoid overheat.

The gained audio signal GAU is directly transmitted to the excursion prediction device 321 of the compensation unit 320. The excursion prediction device 321 receives the gained audio signal GAU, and predicts an excursion probably generated by the speaker SPK corresponding to the gained audio signal GAU, so as to generate a predicted excursion parameter. The non-linear compensation device 322 is coupled to the excursion prediction device 321 and the excursion detection device 333 in the feedback unit 330. The non-linear compensation device 322 receives the predicted excursion parameter generated by the excursion prediction device 321 and the detected parameter PF1 detected by the excursion detection device 333. The non-linear compensation device 322 determines whether the predicted excursion parameter enters a non-linear region of a force factor or stiffness for the speaker SPK in response to the gained audio signal GAU and the predicted excursion parameter of the excursion prediction device 321. Moreover, when the non-linear compensation device 322 determines that the predicted excursion parameter enters the non-linear region of the force factor or stiffness for the speaker SPK, the non-linear compensation device 322 further generates an output audio signal DOAU according to the gained audio signal GAU, the predicted excursion parameter and the first detected parameter PF1 in response to the gained audio signal GAU.

It should be noted that when the non-linear compensation device 322 determines that the predicted excursion parameter does not enter the non-linear region of the force factor or stiffness for the speaker SPK, the non-linear compensation device 322 may directly transmit the gained audio signal GAU as the output audio signal DOAU.

Figure 4:
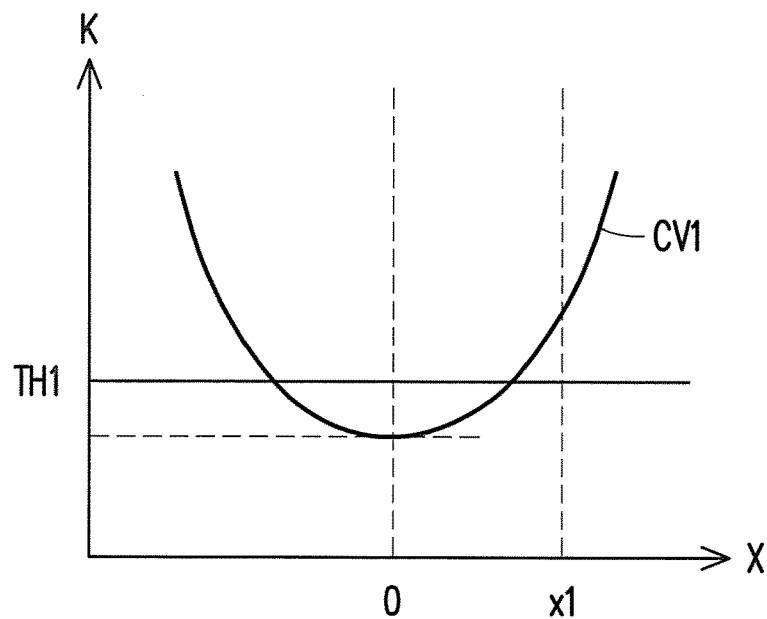
FIG. 4 illustrates a relationship curve between stiffness and excursion of a speaker.
Figure 5:
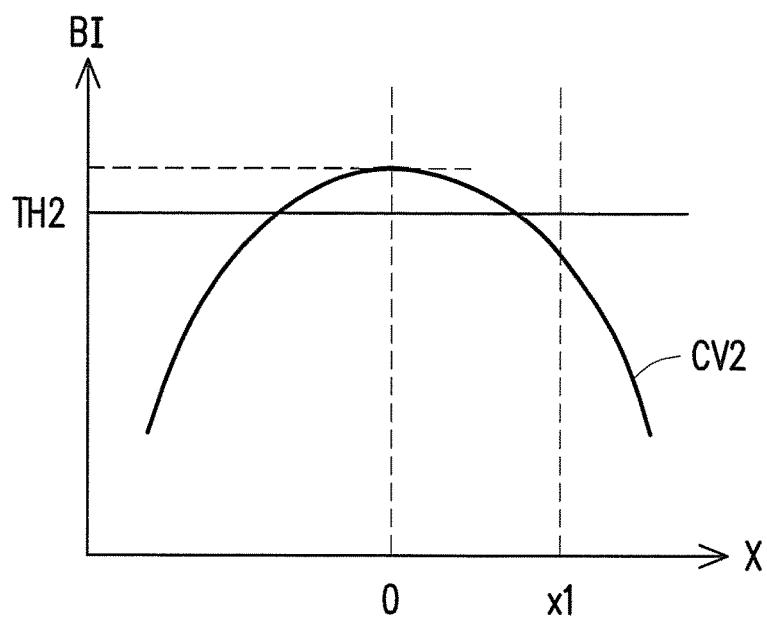
FIG. 5 is illustrates a relationship curve between a force factor and excursion of a speaker.

Implementation detail of the non-linear compensation device 322 may refer to FIG. 4 and FIG. 5, FIG. 4 illustrates a relationship curve between stiffness and excursion of the speaker, and FIG. 5 illustrates a relationship curve between a force factor and excursion of the speaker. In FIG. 4, a curve CV1 represents a relationship between a speaker stiffness K and an excursion X, where when a predicted excursion x1 corresponds to a value on the curve CV1 that is greater than a threshold TH1, it represents that the excursion x1 enters the non-linear region.

Moreover, in FIG. 5, a curve CV2 represents a relationship between a speaker force factor B1 and the excursion X, where when the predicted excursion x1 corresponds to a value on the curve CV2 that is greater than a threshold TH2, it represents that the excursion x1 enters the non-linear region. The aforementioned determination method is only an example, which can also be implemented in other manners.

Moreover, regarding a compensation manner, the non-linear compensation device 322 may take an equation used for describing physical characteristics of the speaker SPK as a first model. According to the first model and the detected parameter PF1, when the gained audio signal GAU enters the non-linear region of a first physical parameter of the speaker SPK, it is expected that the audible sound reproduced by the speaker SPK is a distorted version of the gained audio signal GAU, which is denoted by Sa1d. In an example, the distorted version can be represented by the gained audio signal GAU and a distorted component (which is denoted by disn), where $Sa1d(t)=m1*GAU(t)+disn(t)$, or can be represented in a digital form, where m1 represents a scaling coefficient. In this way, the non-linear compensation device 322 may perform compensation to generate the output audio signal OAU according to the first model, such that the output audio signal OAU includes an inverse component (which is denoted by disn-1(t)) corresponding to the expected distorted component. The output audio signal OAU can be represented as: $OAU(t)=m2*GAU(t)+disn\text{-}1(t)$, where m2 represents a coefficient. In this way, the inverse component may compensate distortion, such that the speaker SPK may reproduce the audio signal in a less distortion or non-distortion manner.

The signal converter 340 is coupled between the non-linear compensation device 322 and the amplifier AMP. The signal converter 340 receives the output audio signal DOAU in a digital format, and converts the output audio signal DOAU in the digital format into an output audio signal AOAU in an analog format, and transmits the output audio signal AOAU in the analog format to the amplifier AMP. The amplifier AMP drives the speaker SPK to send an audible sound according to the output audio signal AOAU.

Regarding the feedback unit 330, the signal converter 331 receives feedback signals SFB1 and SFB2 in the analog format from the speaker SPK and the amplifier AMP, and converts the feedback signals SFB1 and SFB2 in the analog format into the digital format for transmitting to the temperature detection device 332 and the excursion detection device 333. The temperature detection device 332 and the excursion detection device 333 respectively detect the detected parameters PF2 and PF1 according to the received signals.

Where, the excursion detection device 333 obtains the detected excursion of the speaker SPK according to an impedance model. The impedance model is, for example, represented as: $(v-\dot{x}\cdot Bl(x))/Z=i$ (equation 1), where $\dot{x}$ is a derivative of an excursion time, i is a current, which can be represented by the current feedback signal SFB1, v represents a voltage, which can be represented by the voltage feedback signal SFB2, $BL(x)$ is a speaker force factor related to the excursion x, and Z is an impedance of the speaker SPK. For another example, the equation 1 can be represented by a discrete differential equation, and the excursion $x[n]$ is accordingly solved.

The temperature detection device 332 may output the detected parameter PF2 representing a temperature of the speaker SPK according to a relationship between the temperature and the impedance of the speaker SPK. The relationship between the temperature and the impedance of the speaker SPK is, for example, represented as: $R=R_0[1+\alpha(T-T_\infty)]$ (equation 2), where the parameter $T_\infty$ is an environment temperature, $R_0$, and the parameter $\alpha$ are constants. Therefore, the variation of the temperature of the speaker SPK is proportional to the variation of the impedance of the speaker SPK, which can be determined according to the detected impedance.

Regarding the bias adjustment unit 350, the bias adjustment unit 350 includes the level detection device 351 and the boost control device 352. The level detection device 351 detects a level of the input audio signal IN_AU to determine whether to raise a bias of the amplifier AMP. The boost control device 352 adjusts a magnitude of the bias supplied to the amplifier AMP according to a detection result of the level detection device 351.

Figure 6:
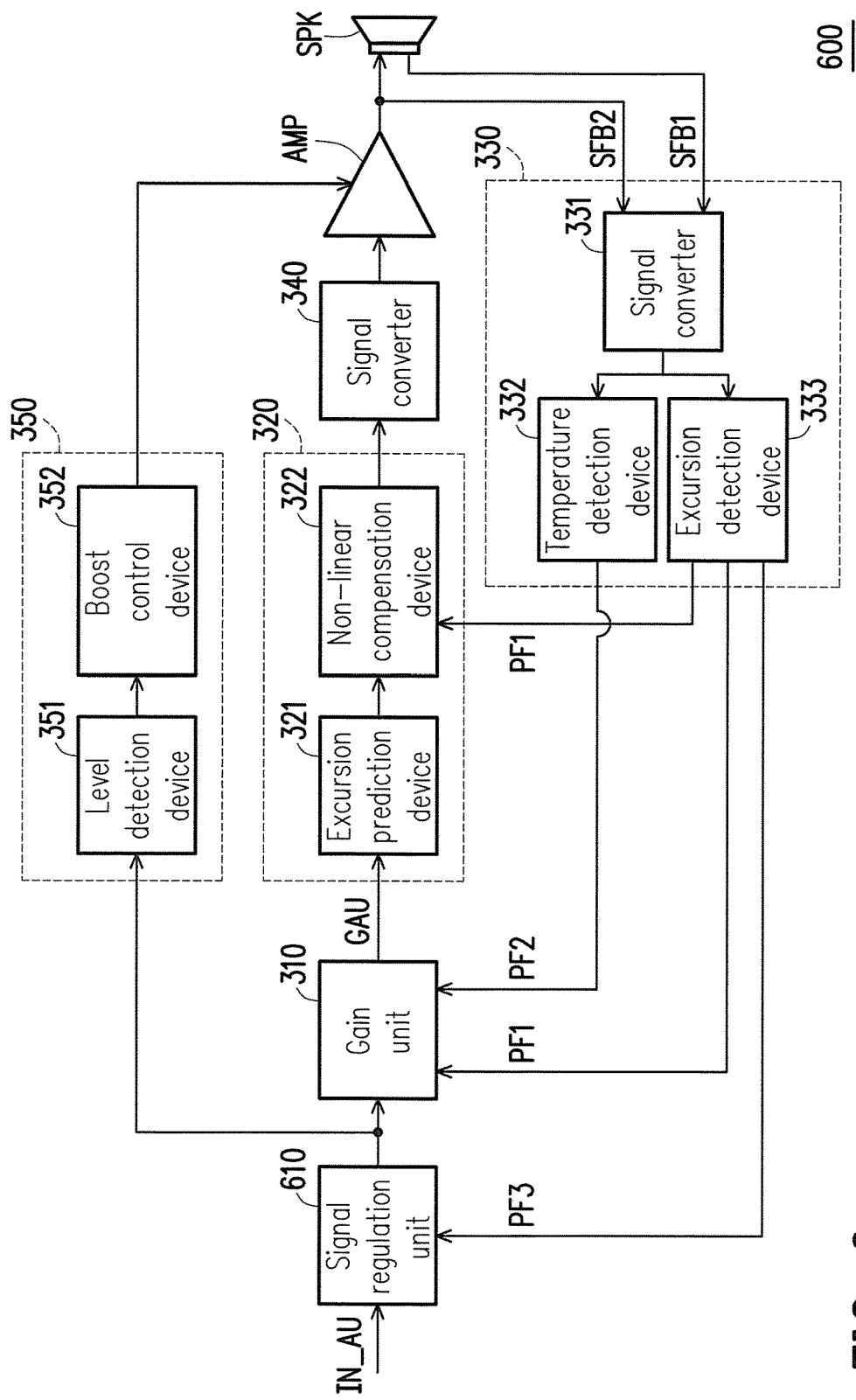
FIG. 6 is a schematic diagram of a sound producing system according to still another embodiment of the invention.

Referring to FIG. 6, FIG. 6 is a schematic diagram of a sound producing system according to still another embodiment of the invention. Different to the embodiment of FIG. 3, the sound producing system 600 further includes a signal regulation unit 610. The signal regulation unit 610 is coupled in a path from which the gain unit 310 receives the input audio signal IN_AU. The signal regulation unit 610 performs a resonance frequency tracking operation based on signal regulation. In an embodiment of the invention, the signal regulation unit 610 adopts resonance frequency tracking and signal regulation of inverse compensation. Namely, the signal regulation unit 610 may implement a signal processing operation to perform signal regulation on an input audio signal IN_AU (for example, represented in a digital signal format), where the signal processing operation is, for example, implemented by a filter by filtering the input audio signal IN_AU according to an inverse compensation characteristic such as infinite impulse response (IIR) digital filter. The filter has a characteristic of performing inverse compensation and dynamic compensation for a resonance peak of the excursion of the speaker SPK, which is implemented through the current feedback signal SFB1 and the voltage feedback signal SFB2 and a corresponding impedance analysis.

Figure 7A:
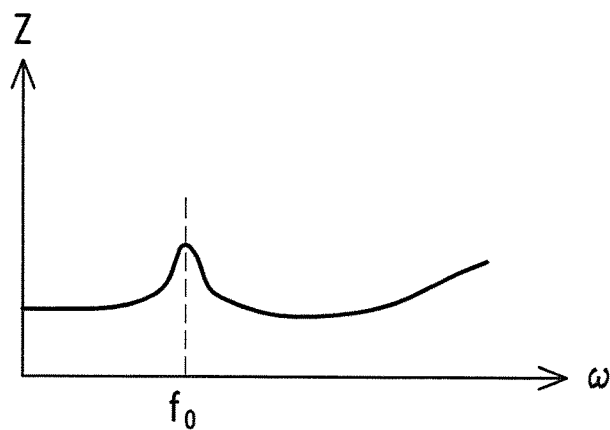
FIG. 7A is a relationship diagram of impedance and frequency of a speaker.
Figure 7B:
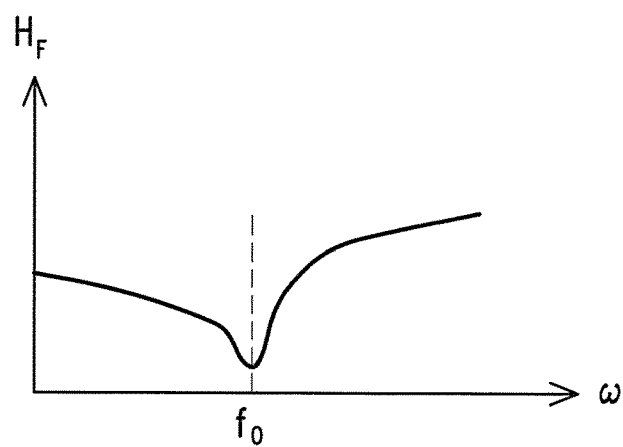
FIG. 7B illustrates an inverse compensation characteristic curve of a speaker.
Figure 7C:
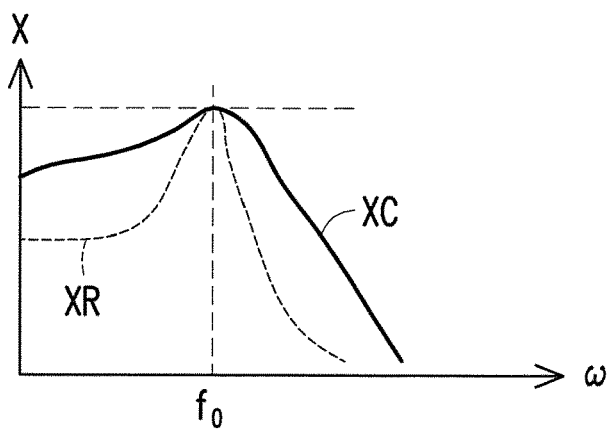
FIG. 7C illustrates a different inverse compensation characteristic curve.

Referring to FIG. 6 and FIG. 7A-FIG. 7C, FIG. 7A is a relationship diagram of impedance and frequency of the speaker FIG. 7B illustrates an inverse compensation characteristic curve of the speaker, and FIG. 7C illustrates a different inverse compensation characteristic curve. In order to implement the resonance frequency tracking, the signal regulation unit 610 receives a parameter PF3, where the parameter PF3 represents information related to a current variation of the resonance frequency of the speaker. The parameter PF3 is, for example, produced by the excursion detection device 333. For example, the signal regulation unit 610 obtains an initial value of the resonance frequency, and executes the signal regulation according to the inverse compensation curve of FIG. 7B (or referred to as a conversion function $H_F$). The conversion function $H_F$ of FIG. 7B is obtained by performing an inverse operation on the result of the impedance analysis (the result shown in FIG. 7A). The conversion function $H_F$ is referred to as the inverse compensation characteristic curve, which has a minimum value corresponding to the resonance frequency of the speaker SPK. In FIG. 7A, the relationship between the impedance Z and the frequency of the speaker SPK is illustrated, in which the resonance frequency $f_0$ is shown. In this way, when the input audio signal IN_AU has a frequency component close to the resonance frequency $f_0$ of the speaker SPK, the input audio signal IN_AU can be adjusted and particularly decreased. Regarding a digital signal value, the regulated signal substantially has a greater headroom in bit number than the input audio signal IN_AU. With assistance of the control of the gain value of the gain unit 310 and other processing of subsequent phases, the gain level beyond the characteristic curve thereof can be used to improve the audio signal reproduced by the speaker SPK. Referring to FIG. 7C, which illustrates comparison between a characteristic curve (denoted by XC) of excursion and frequency corresponding to the reproduced audio signal output by the sound producing system 300 and a characteristic curve (denoted by XR) of excursion and frequency of the speaker under a rated power. In FIG. 7C, the excursion corresponding to the solid line XC is greater than the excursion corresponding to the dash line XR under the frequency range. Therefore, the speaker SPK is protected, and the loudness of the speaker SPK is also strengthened.

Moreover, the functional blocks (including implementations of software modules, hardware components, devices or units) have the respective initial control parameters, for example, parameters such as the maximum gain, an attack time, a release time, etc. in the gain unit. In some embodiments, when it is detected that an acoustic condition is drastically varied (for example, detected by the feedback unit), the initial parameters should be switched to another set of parameters to ensure a stable control. For example, the gain unit 310 detects the detected parameter PF1 and the detected parameter PF2 respectively representing an excursion and a temperature. When the temperature is initially close to a temperature threshold, the gain unit 310 switches a target gain value to a smaller value. When the excursion is away from an excursion threshold, the gain unit 310 switches the target gain value to a suitable value. If the acoustic condition is varied to cause a variation of the resonance frequency, the temperature threshold and the excursion threshold should be switched to another set of thresholds to ensure a stable gain control. Moreover, other parameters such as elasticity of the speaker SPK can also be incorporated as determination conditions for switching the parameter sets.

Figure 8:
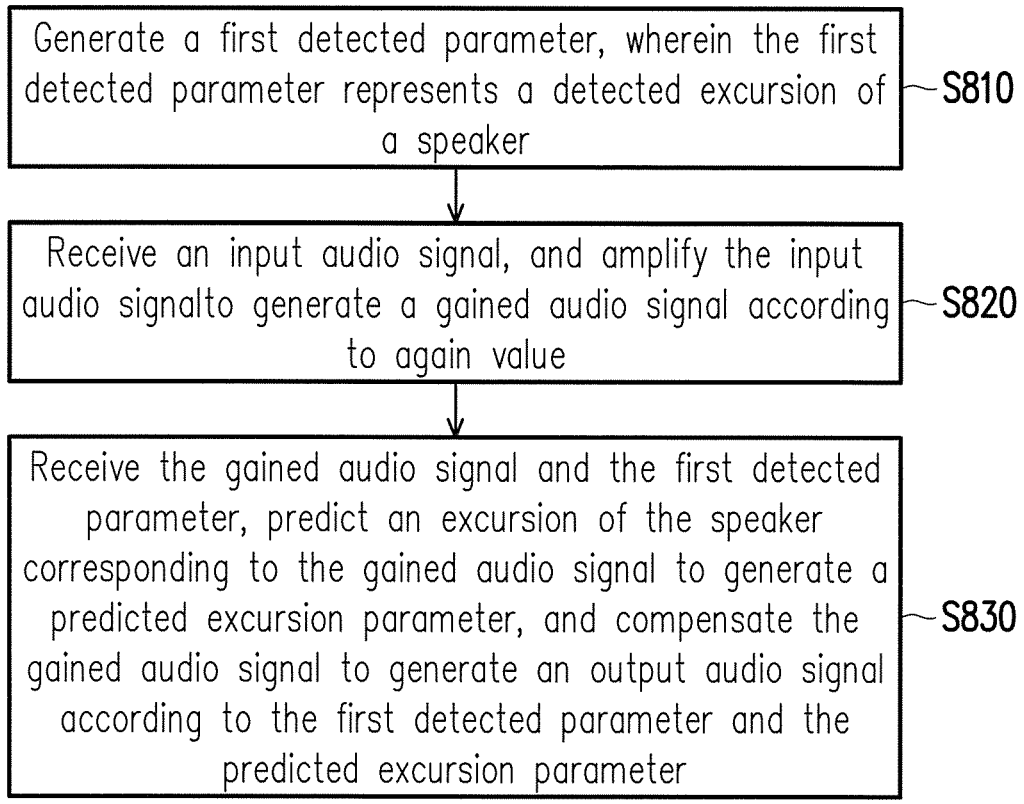
FIG. 8 is a flowchart illustrating a control method of sound producing according to an embodiment of the invention.

Referring to FIG. 8, FIG. 8 is a flowchart illustrating a control method of sound producing according to an embodiment of the invention. In step S810, a first detected parameter is generated, where the first detected parameter represents a detected excursion of the speaker. Then, in step S820, an input audio signal is received, and the input audio signal is amplified to generate a gained audio signal according to a gain value. In step S830, the gained audio signal and the first detected parameter are received, and an excursion of the speaker corresponding to the gained audio signal is predicted to generate a predicted excursion parameter, and the gained audio signal is compensated to generate an output audio signal according to the first detected parameter and the predicted excursion parameter.

Implementation details of the aforementioned steps have been described in detail in the aforementioned embodiments, and details thereof are not repeated.

Figure 9:
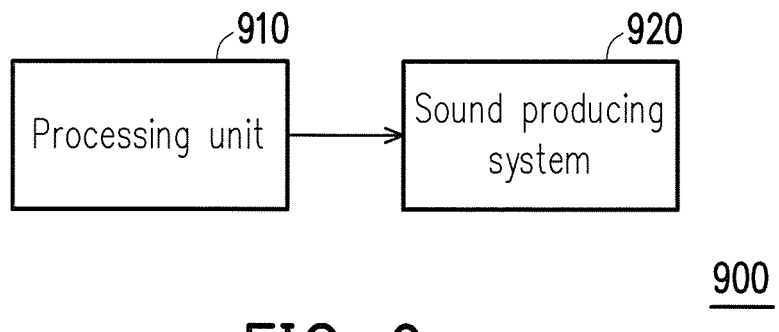
FIG. 9 is a schematic diagram of a handheld electronic apparatus according to an embodiment of the invention.

Referring to FIG. 9, FIG. 9 is a schematic diagram of a handheld electronic apparatus according to an embodiment of the invention. The handheld electronic apparatus 900 includes a processing unit 910 and a sound producing system 920. The processing unit 910 is coupled to the sound producing system 920 for providing the input audio signal IN_AU to the sound producing system 920. The sound producing system 920 can be implemented by any one of the sound producing systems 200, 300 and 600 of the aforementioned embodiments. The processing unit 910 can be implemented by a processor, a digital signal processor, or an application specific integrated circuit, or implemented by a programmable integrated circuit such as a micro controller, a field programmable gate array, etc., where a hardware description language (HDL) is, for example, adopted for designing In summary, in the invention, the compensation unit is adopted to perform a compensation operation on the amplified gained audio signal. Namely, the sound producing system of the invention directly performs the compensation operation on the excursion of the speaker generated corresponding to the amplified gained audio signal used for driving the speaker. In this way, the compensation operation can be more directly and efficient, and the compensation operation performed by the compensation unit can be further simplified to improve the efficiency of the audio producing system.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A sound producing system, comprising:
    a speaker, generating an audible sound according to an output audio signal;
    a feedback circuit, coupled to the speaker, and configured to generate a first detected parameter, wherein the first detected parameter represents a detected excursion of the speaker;
    a first amplifier, receiving an input audio signal, and amplifying the input audio signal to generate a gained audio signal according to a gain value, wherein the gain value is a real number larger than 1; and
    a processing circuit, coupled to the first amplifier and the feedback circuit, wherein the processing circuit receives the gained audio signal and the first detected parameter, predicts an excursion of the speaker corresponding to the gained audio signal to generate a predicted excursion parameter, and compensates the gained audio signal to generate the output audio signal according to the first detected parameter and the predicted excursion parameter,
    wherein the feedback circuit comprises: a signal converter, coupled to the speaker to receive at least one feedback signal, and an excursion detection device, coupled to the signal converter, and configured to output the first detected parameter according to an impedance model of the speaker in response to the at least one feedback signal output by the signal converter in a digital form.

2. The sound producing system as claimed in claim 1, wherein when the predicted excursion parameter enters a non-linear region of a force factor or stiffness for the speaker, the processing circuit compensates the gained audio signal to generate the output audio signal.

3. The sound producing system as claimed in claim 2, wherein the processing circuit comprises:
    an excursion prediction device, directly receiving the gained audio signal, and predicting the excursion of the speaker corresponding to the gained audio signal to generate the predicted excursion parameter; and
    a non-linear compensation device, coupled to the excursion prediction device, and determining whether the predicted excursion parameter enters the non-linear region of the force factor or the stiffness for the speaker in response to the gained audio signal and the predicted excursion parameter of the excursion prediction device, and when the predicted excursion parameter enters the non-linear region of the force factor or the stiffness for the speaker, the non-linear compensation device further generates the output audio signal according to the gained audio signal, the predicted excursion parameter and the first detected parameter in response to the gained audio signal.

4. The sound producing system as claimed in claim 3, further comprising:
    the signal converter, coupled between the non-linear compensation device and the speaker, converting the output audio signal of a digital format into an analog format, and transmitting the output audio signal of the analog format to the speaker through a second amplifier.

5. The sound producing system as claimed in claim 1, wherein the feedback circuit further generates a second detected parameter, and the second detected parameter represents a detected temperature of the speaker, wherein when the second detected parameter represents that a temperature of the speaker is increased, the first amplifier decreases the gain value to control the temperature of the speaker according to the second detected parameter.

6. The sound producing system as claimed in claim 1, wherein the feedback circuit comprises:
    a temperature detection device, coupled to the signal converter, and configured to output a second detected parameter according to a relationship between a temperature and an impedance of the speaker in response to the at least one feedback signal,
    wherein the first detected parameter and the second detected parameter are provided to the first amplifier, and the first amplifier determines the gain value according to the first detected parameter and the second detected parameter.

7. The sound producing system as claimed in claim 6, wherein when the first detected parameter represents that the excursion of the speaker is increased, the first amplifier decreases the gain value to control the excursion of the speaker to be under a maximum excursion of the speaker.

8. The sound producing system as claimed in claim 1, further comprising:
    a bias adjustment circuit, configured to:
    detect a signal level of the input audio signal; and
    adjust a level of a bias signal when the signal level of the input audio signal exceeds a threshold, wherein the bias signal is supplied to a second amplifier, and the second amplifier is coupled to the speaker used for reproducing the audible sound in response to the output audio signal.

9. The sound producing system as claimed in claim 1, further comprising:
    a signal regulation circuit, coupled to the feedback circuit and a path from which the first amplifier receives the input audio signal, wherein the signal regulation circuit is configured to:
    receive a parameter of the feedback circuit and the input audio signal, wherein the parameter represents information corresponding to a resonance frequency of the speaker;
    filter the input audio signal according to an inverse compensation characteristic, wherein the inverse compensation characteristic represents a conversion function based on an inverse conversion of an excursion conversion function of the speaker, and the conversion function has the resonance frequency of the speaker;

output a first audio signal based on the filtered input audio signal, wherein the inverse compensation characteristic has a minimum value corresponding to the resonance frequency of the speaker, and the first audio signal substantially has a greater headroom in bit number than the input audio signal; and use the parameter representing the information corresponding to the resonance frequency of the speaker to modify the conversion function representing the inverse compensation characteristic.

10. The sound producing system as claimed in claim 9, wherein when the input audio signal has a frequency component close to the resonance frequency of the speaker, the signal regulation circuit decreases the input audio signal.

11. A handheld electronic apparatus, comprising:
a processor, generating an input audio signal; and
the sound producing system as claimed in the claim 1, coupled to the processor and receiving the input audio signal, and producing the audible sound according to the output audio signal.

12. A control method of sound producing, comprising:
generating a first detected parameter by a feedback circuit coupled to a speaker, wherein the first detected parameter represents a detected excursion of the speaker, and the first detected parameter is generated by detecting an excursion produced by a diaphragm of the speaker;
receiving an input audio signal by a first amplifier, and amplifying the input audio signal to generate a gained audio signal according to a gain value by the first amplifier, wherein the gain value is a real number larger than 1 ; and
receiving the gained audio signal and the first detected parameter by a processing circuit coupled to the first amplifier and the feedback circuit, predicting an excursion of the speaker corresponding to the gained audio signal to generate a predicted excursion parameter by the processing circuit, and compensating the gained audio signal to generate an output audio signal according to the first detected parameter and the predicted excursion parameter by the processing circuit, wherein the speaker generates an audible sound according to the output audio signal,
wherein the feedback circuit comprises: a signal converter, coupled to the speaker to receive at least one feedback signal, and an excursion detection device, coupled to the signal converter, and configured to output the first detected parameter according to an impedance model of the speaker in response to the at least one feedback signal output by the signal converter in a digital form.

13. The control method of sound producing as claimed in claim 12, wherein the step of compensating the gained audio signal to generate the output audio signal according to the first detected parameter and the predicted excursion parameter by the processing circuit comprises:
determining whether the predicted excursion parameter enters a non-linear region of a force factor or stiffness for the speaker in response to the gained audio signal and the predicted excursion parameter; and
generating the output audio signal according to the gained audio signal, the predicted excursion parameter and the first detected parameter in response to the gained audio signal when the predicted excursion parameter enters the non-linear region of the force factor or the stiffness for the speaker.

14. The control method of sound producing as claimed in claim 12, further comprising:
converting the output audio signal of a digital format into an analog format, and transmitting the output audio signal of the analog format to the speaker through a second amplifier.

15. The control method of sound producing as claimed in claim 12, further comprising:
generating a second detected parameter, wherein the second detected parameter represents a detected temperature of the speaker; and
decreasing the gain value to control a temperature of the speaker according to the second detected parameter when the second detected parameter represents that the temperature of the speaker is increased.

16. The control method of sound producing as claimed in claim 15, further comprising:
decreasing the gain value to control the excursion of the speaker to be under a maximum excursion of the speaker when the first detected parameter represents that the excursion of the speaker is increased.

17. The control method of sound producing as claimed in claim 12, further comprising:
detecting a signal level of the input audio signal; and
adjust a level of a bias signal when the signal level of the input audio signal exceeds a threshold, wherein the bias signal is supplied to a second amplifier, and the second amplifier is coupled to the speaker used for reproducing the audible sound in response to the output audio signal.

18. The control method of sound producing as claimed in claim 12, further comprising:
generating a parameter according to a resonance frequency of the speaker;
filtering the input audio signal according to an inverse compensation characteristic, wherein the inverse compensation characteristic represents a conversion function based on an inverse conversion of an excursion conversion function of the speaker, and the conversion function has the resonance frequency of the speaker;
outputting a first audio signal based on the filtered input audio signal, wherein the inverse compensation characteristic has a minimum value corresponding to the resonance frequency of the speaker, and the first audio signal substantially has a greater headroom in bit number than the input audio signal; and
using the parameter representing the information corresponding to the resonance frequency of the speaker to modify the conversion function representing the inverse compensation characteristic.

19. The control method of sound producing as claimed in claim 18, further comprising:
decreasing the input audio signal when the input audio signal has a frequency component close to the resonance frequency of the speaker.

* * * * *